(12) United States Patent
Clyne

(10) Patent No.: US 6,273,605 B1
(45) Date of Patent: Aug. 14, 2001

(54) SEMICONDUCTOR WIREBOND MACHINE LEADFRAME THERMAL MAP SYSTEM

(75) Inventor: Craig T. Clyne, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/505,332

(22) Filed: Feb. 16, 2000

Related U.S. Application Data

(63) Continuation of application No. 08/943,782, filed on Oct. 3, 1997, now Pat. No. 6,071,009.

(51) Int. Cl.[7] .................................................. G01K 3/00
(52) U.S. Cl. ........................... 374/137; 374/141; 374/161
(58) Field of Search ................................... 374/137, 161, 374/141

(56) References Cited

U.S. PATENT DOCUMENTS

| | | | |
|---|---|---|---|
| 4,265,117 | 5/1981 | Thoma et al. ................... | 73/359 R |
| 4,763,827 | 8/1988 | Watanabe et al. ............... | 228/102 |
| 4,764,670 | 8/1988 | Pace et al. ...................... | 250/226 |
| 4,789,992 | 12/1988 | Wickersheim et al. .......... | 374/161 |
| 4,895,156 | 1/1990 | Schulze .......................... | 128/634 |
| 4,997,286 | 3/1991 | Fehrenbach et al. ............ | 374/131 |
| 5,035,513 | 7/1991 | Fehrenbach et al. ............ | 374/161 |
| 5,107,445 | 4/1992 | Jensen et al. ................... | 364/525 |
| 5,193,912 | 3/1993 | Saunders ........................ | 374/179 |
| 5,211,480 | 5/1993 | Thomas et al. ................. | 374/161 |
| 5,256,566 | 10/1993 | Bailey ............................. | 437/233 |
| 5,294,198 | 3/1994 | Schlagheck ..................... | 374/4 |
| 5,470,155 | 11/1995 | Jensen ............................ | 374/161 |
| 5,500,502 | 3/1996 | Horita et al. ................... | 219/121.63 |
| 5,669,545 | 9/1997 | Pham et al. ..................... | 228/1.1 |
| 6,033,107 * | 3/2000 | Farina et al. ................... | 374/4 |

OTHER PUBLICATIONS

Luxtron Model 790 Fluoroptic Thermometer, 4 pps., No date.
Kulicke & Soffa Industries Inc. 1499 Gold Ball Bonder Plus, 4 pps., No date.
Robert F. Graf, Editor, Modern Dictionary of Electronics, Sixth Edition, p. 690, 1997.

* cited by examiner

Primary Examiner—Randy W. Gibson
(74) Attorney, Agent, or Firm—TraskBritt

(57) ABSTRACT

A method and apparatus for measuring the surface temperatures of wire-bonded semiconductors and the like for preparing thermal maps include a conventional ultrasonic wire bonding machine adapted for mounting a fluorescence-decay temperature sensor in the capillary holder. A trigger box circuit is provided to trigger a temperature measurement based on initiation of an electrical voltage signal from the ultrasonic bonding controller. A computer is provided for coordinating the stage control and temperature measurements, and for collating and plotting the temperature, time and location indications as thermal maps and other displayed/printed correlations.

48 Claims, 4 Drawing Sheets

SEMICONDUCTOR WIREBOND MACHINE LEADFRAME THERMAL MAP SYSTEM

CROSS REFERENCE TO RELATED APPLICATION

This application is a continuation of application Ser. No. 08/943,782, filed Oct. 3, 1997, now U.S. Pat. No. 6,071,009.

BACKGROUND OF THE INVENTION

1. Field of the Invention

This invention relates generally to testing methods and apparatus for semiconductor devices. More particularly, the invention pertains to a method and apparatus for measuring localized temperatures present on semiconductor devices and the like for research and development purposes.

2. State of the Art

Modern integrated circuit (IC) devices are commonly formed by joining the electrically active bond pads of a semiconductor die to the conductive lead fingers of a leadframe with metal wires. The wire bonding process may comprise:

a. thermocompression bonding, which uses pressure and elevated temperature, typically 300–400° C. to bond the wire ends to the bond pads and leadframe;

b. thermosonic bonding, in which ultrasonic energy is combined with compression at temperatures of about 150° C.; or c. ultrasonic bonding, in which ultrasonic energy is typically applied at ambient temperatures. This method is generally limited to some specific metals such as aluminum or aluminum alloy wires on aluminum or gold pads.

As is well known, the functionality of manufactured electronic devices depends upon successful bonding of the wires to the bond pads of the die and to the lead fingers.

In each of thermocompression bonding and thermosonic bonding, reliability of the bonding process depends upon the temperatures of the elements being joined.

It is important for a semiconductor device manufacturer to have the capability for evaluating the quality of conductor bonds, such as wirebonds, leadframe to bump bonds, etc. Evaluation of the bonding process includes, e.g., destructive ball shear tests and wire bond pull tests as well as contaminant tests such as by spectrographic analysis.

In addition, thermal analysis of the die and leadframe may be done during the conductor bonding operations to yield an indication as to wire bonding quality. Thus, for example, U.S. Pat. No. 5,500,502 of Horita et al. describes a process for bonding a leadframe to a bump using laser irradiation. The state of contact between the leadframe and the bump is then tested using the intensity of the emitted infrared radiation as a measure of the leadframe temperature. Knowing the time lapse between the laser radiation and the measured temperature, the temperature as a function of time may be calculated, particularly a threshold temperature correlated to bond effectiveness and the resulting quality of the wire bond.

The Horita et al. method does not address the testing of wirebonds. Furthermore, the method depends upon the emission and reflection of infrared radiation, which varies with the surface characteristics of the material whose temperature is being measured. As is well known, both semiconductor dies and leadframes are made of a variety of materials, each of which may have a differing emission/reflection temperature function when laser-irradiated. In addition, a wide variety of materials is used for doping semiconductor dice and for coating dice. For example, U.S. Pat. No. 5,256,566 of Bailey teaches the coating of dice with polysilicon. Thus, the infrared temperature meter must be calibrated for each material, making temperature measurements labor intensive.

Furthermore, the presence of contaminants on the die or leadframe surfaces will affect the accuracy of the Horita et al. method.

A method and apparatus for accurately measuring the temperature of very small areas of surfaces, independent of the surface composition, are desirable for research and development purposes in the semiconductor die area.

SUMMARY OF THE INVENTION

The present invention is directed to a method and apparatus for accurately measuring the temperature of precisely defined areas of surfaces of materials having a wide variety of compositions, such as a semiconductor die and/or leadframe.

An apparatus and method for producing a computer-generated thermal map of the surface of a semiconductor die and/or attached leadframe, wafer, or other object are described herein. The apparatus may be used to measure, compile, collate, plot, and display temperatures of a die and its associated leadframe fingers for evaluating a manufacturing process. The apparatus may be configured to back-calculate measured real-time temperatures to a predetermined initial time for preparing thermal maps, e.g., initial or maximum temperatures as a function of location and time.

The apparatus includes (a) a fiber-optic temperature sensor mounted on the bondhead of a wirebonding machine, and connected to (b) a thermometer apparatus which calculates a temperature based on the sensor output via a (c) signal isolation trigger box having a circuit which is connected to the ultrasonic generator output of the wirebonding machine, whereby a temperature measurement is initiated, and to (d) a computer having software for controlling the wirebonding machine and trigger box and for storing and collating temperature measurements (and other measurements) from the thermometer controller and wirebonding machine.

The invention may be applied to temperature measurements on a die, wafer, semiconductor device at any stage of construction, or surfaces of other objects of interest. The temperature measurements may be "rastered" over the surface by the stage controller, using any desired increment of movement, because the temperature sensor tip may have a size approximating the size of the area of which the temperature is to be measured.

BRIEF DESCRIPTION OF THE SEVERAL VIEWS OF THE DRAWINGS

The invention is illustrated in the following figures, wherein the elements are not necessarily shown to scale.

DETAILED DESCRIPTION OF THE INVENTION

A method and apparatus are disclosed herein for measuring temperatures of semiconductor dies and leadframes for producing thermal maps and other representations of the measured temperatures as a function of either location and/or time.

Figure 1:
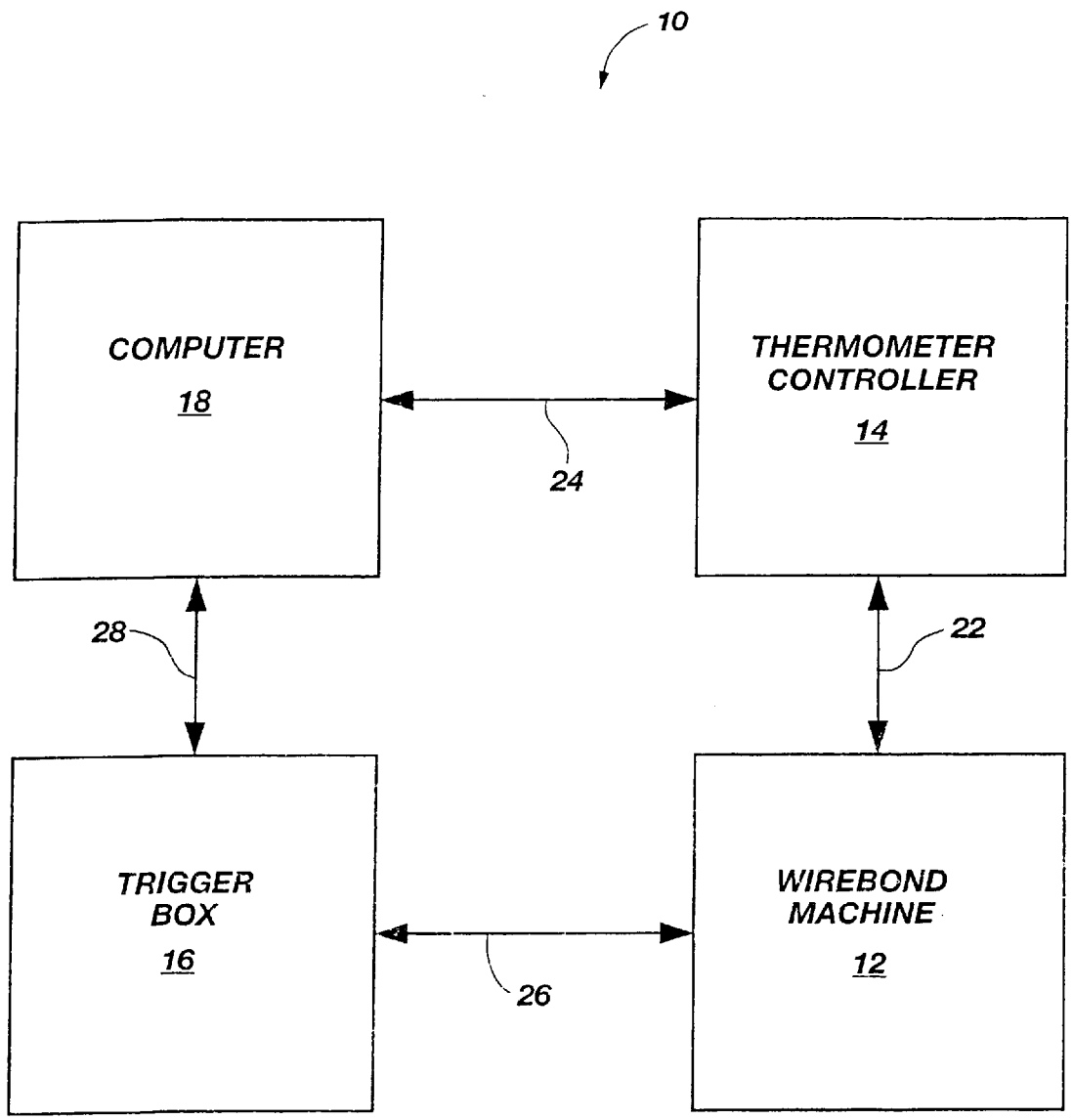
FIG. 1 is a block diagram of a temperature measurement system illustrating the method and apparatus components of the invention for compiling a thermal map of a semiconductor die and leadframe.

With reference to the drawings of FIGS. 1–4, and particularly to FIG. 1, a block diagram shows the four major components of the temperature measuring apparatus 10.

A wire-bonding machine 12 such as exists in the art is modified as described, infra, for obtaining accurate optical temperature signals at or near surface 40 of a semiconductor device 20 (see FIG. 2), and relaying the signals via a fiber-optic lead or cable 22 to a thermometer controller 14. The thermometer controller 14 determines the measured temperatures from the signals and transmits the temperature data from the thermometer controller 14 to a computer 18 via a transmission cable 24 such as a standard IEEE488 bus. The computer 18 may be any suitable standard personal computer (PC) having software for storing and manipulating data including temperature, time and position measurements in digital form, controlling other apparatus, and displaying by monitor or printed document the measured readings in a meaningful correlation.

The invention includes a trigger box 16 which has an electronic trigger circuit connectable to the computer 18 by, e.g., a PC Game Control Adapter Port 28 located thereon. The trigger box 16 provides a signal through computer 18 and transmission cable 24 by which the thermometer controller 14 passes a light pulse through the fiber-optic cable 22 initiating a temperature measurement. Typically, the wire bonding machine 12 has its own software programs for sequentially positioning the semiconductor device 20 and initiating wirebonding by, e.g., ultrasonic generation. The circuit of the trigger box 16 is shown connected via transmission cable 26 to the ultrasonic generator signal $V_{out}$ of the wire bonding system for coordination of the temperature measurement activation with position control of the wirebonding machine 12. In the present invention, the ultrasonic generation signal otherwise used for wirebonding is translated into a temperature measurement signal. The positioning and activation of the temperature probe (see FIG. 2) are thus controlled by the software programs of the wirebonding machine 12 and/or the computer 18 to provide the desired location-time response.

The software of the computer 18 coordinates the timing, recording, and correlation of temperature measurements with position and time.

Figure 2:
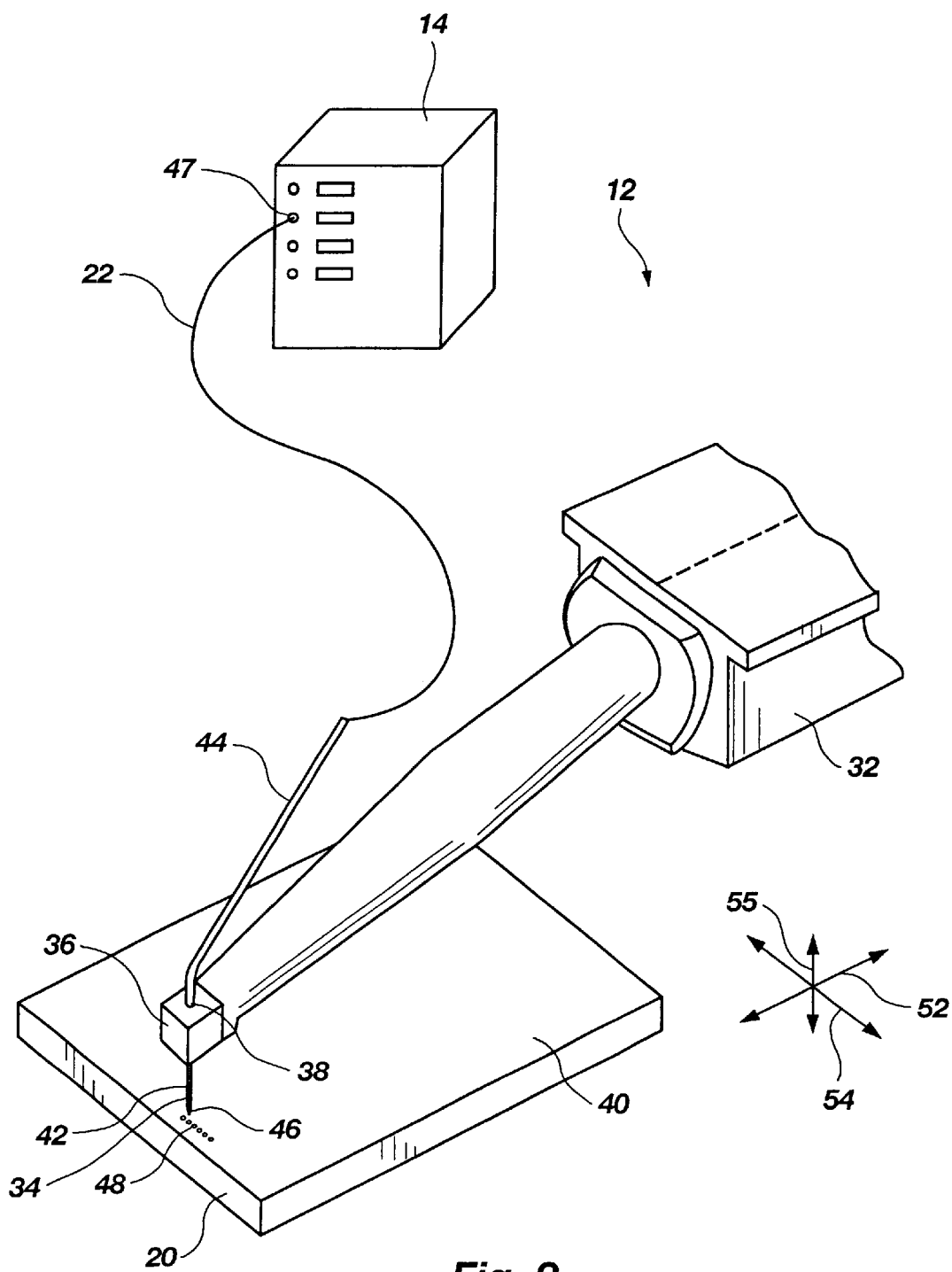
FIG. 2 is a partial perspective view of a fiber-optic temperature sensor mounted on a wire bonder head for thermal mapping of a die in accordance with the invention.

In FIG. 2, an exemplary bondhead 32 of a wirebonding machine 12 is depicted as including a bonding arm 34 with a terminal capillary holder 36. The capillary holder 36 includes a channel 38 through which a wire-dispensing capillary normally passes, dispensing wire for bonding a semiconductor die to a leadframe. As shown in the modification of FIG. 2, an optic temperature sensor 42 with attached fiber-optic lead 22 is mounted in a sensor mount 44 of the invention, and the sensor mount is, in turn, placed in the channel 38. Thus, the sensor mount 44 replaces the capillary in this configuration. The sensor 42 has a sensor tip 46, and an opposite, i.e., signal output end 47 of the fiber-optic lead 22 conducts pulses of light from the thermometer controller 14 to the sensor tip 46, and conducts the resulting fluorescence in the reverse direction to the thermometer controller for calculation of a temperature.

The optic sensor 42 has a sensing tip 46 which may comprise a phosphorescent material which, following activation by a pulse of light radiation, emits fluorescent light at a decaying rate dependent upon temperature. For some applications, the phosphor may be applied as a coating to the measured surface, and the emitted light signal detected remotely, i.e. without contact of the sensor with the surface. Temperature measurement sensors and thermometer controllers using the above-described principles are commercially available from Luxtron Corporation, Santa Clara, Calif., for example, as embodied in a Luxtron Model 790 Fluoroptic™ Thermometer. A suitable available diameter of a sensor tip 46 is approximately 25 microns. Thus, temperatures of small areas on a semiconductor die, lead finger, etc. (as small as about 25 microns) may be accurately determined in about 500 milliseconds using such a sensor tip 46.

As shown in FIG. 2, the temperatures of the active surface 40 of a semiconductor device 20 may be rapidly determined at each of an array of closely spaced measurement locations 48. These locations 48 may be on the semiconductor device surface 40, leadframe surface, or other surface. The apparatus may be used for measuring temperatures of both inner leads and outer leads of a semiconductor device. As is known in the art, the stage or platform, not shown, upon which device 20 is mounted, may be moved, i.e., "rastered" along small directional increments in both an X-axis 52 and a Y-axis 54, controlled by a stage or platform movement program within the wirebond machine 12 or in computer 18. In addition, the stage or the bonding arm 34 may be moved in a vertical Z-axis 55 to control the proximity of the sensor tip 46 to the surface 40 being measured. Temperature measurements may be obtained in rapid succession at the desired locations and times, enabling creation of thermal maps indicating surface temperatures as a function of location and/or time. If desired, the temperatures prior to the first measurement, e.g., a maximum initial temperature, may be estimated by rearward extrapolation of a subsequently-measured time-temperature curve.

Figure 3:
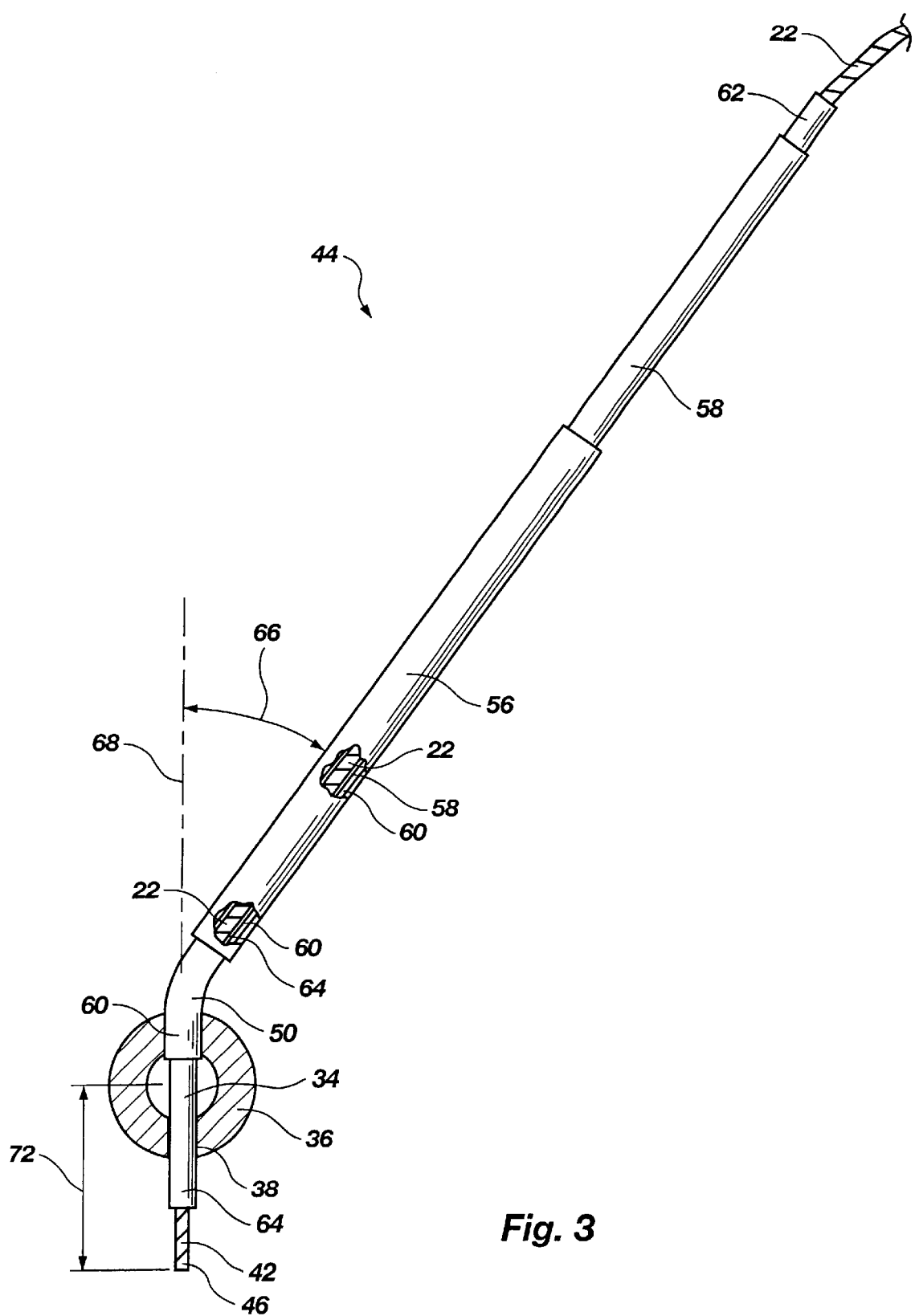
FIG. 3 is a side view of an optical sensor mount of the invention.

Referring to drawing FIG. 3, shown is a sensor mount 44 of the invention, placed in a channel 38 of a capillary holder 36, the latter shown with an annular cross-section. The sensor mount 44 comprises a series of tubing members 56, 58, 60, 62 and 64 which are concentrically, coaxially fitted together to form a rigid mount through which a fiber-optic lead or cable 22 passes. The mount 44 is shown as including an outer housing 56 into which an upper housing 58 and a lower housing 60 are fitted. The lower housing 60 is shown with a bend 50 having an angle 66 of about 15 degrees to about 60 degrees (15° to 60°). Thus, the outer housing 56 will be at an angle 66 with respect to the axis 68 of the sensor 42. An upper cable support 62 is fitted into the upper end of the upper housing 58, and a lower sensor support 64 is fitted into the lower end of the lower housing 60 before it is bent. The fiber-optic cable or lead 22 fits within the sensor mount 44. The sensor 42 may be press-fitted or cemented in the lower sensor support 64 to prevent any movement therein. It is important that the sensor 42 is uniformly positioned in the capillary holder 36 for uniformly precise contact with, or distance from, the surface 40 whose temperature is to be measured. Thus, the distance 72 between the center of the bonding arm 34 and the sensor tip 46 is maintained at a constant value.

An exemplary sensor mount 44 may be formed using the following elements for an optical sensor of approximately 0.026 inch diameter:

An Outer Housing 56: approximately 1.50 inches long stainless steel tubing, having an outside diameter equal to approximately 0.109 inch, an inside diameter equal to approximately 0.085 inch.

An Upper Housing 58: approximately 1.80 inches long stainless steel tubing, having an outside diameter equal to approximately 0.083 inch and an inside diameter equal to approximately 0.063 inch.

A Lower Housing 60: approximately 0.80 inch long stainless steel tubing, having an outside diameter equal to approximately 0.083 inch and an inside diameter equal to approximately 0.063 inch.

An Upper Cable Support 62: approximately 0.25 inch long stainless steel tubing, having an outside diameter equal to approximately 0.065 inch reduced to 0.061 inch and an inside diameter equal to approximately 0.047 inch.

A Lower Sensor Support 64: approximately 0.65 inch long stainless steel tubing, having an outside diameter equal to approximately 0.063 inch and an inside diameter of approximately 0.023 inch drilled out to a 0.026 inch diameter.

The sensor 42 with fiber-optic cable 22 is strung through the upper cable support 62, upper housing 58, outer housing 56, lower housing 60, and lower sensor support 64. The sensor 42 is fixed within the lower sensor support 64 so that the arm-to-sensor tip distance 72 conforms to that programmed into the wirebonder software. A useful distance 72 for a particular wirebond machine may be 0.36 inch.

Following assembly of the lower sensor support 64 within the lower housing 60, both are bent at a bend radius of, e.g., 0.25 inch. The upper housing 58 and lower housing 60 (containing a part of the lower sensor support 64 and the fiber-optic cable 22) are partially inserted and fitted within the outer housing 56. The upper cable support 62 is fixed in the upper housing 58.

The completed sensor mount 44 is inserted in the capillary channel 38 or into another channel, not shown, in an extrinsic or intrinsic part of the "bonding" arm 34, maintaining the desired arm-to-sensor tip distance 72. The sensor mount 44 may be permanently bonded to a capillary holder 36 which is removable from the bonding arm 34. Sensors 42 of other sizes or types are easily interchanged. For example, specific sensors are available for contact and non-contact applications.

While sensors 42 having tips 46 having a diameter of approximately 25 microns are available, sensors of any other suitable sizes and types may be used, generally requiring a modification in the tubing sizes used to form the sensor mount 44.

Materials other than stainless steel may be used, and, of course, members of other dimensions may be used, depending upon the dimensions of the fiber-optic sensor 42 and capillary channel 38.

Figure 4:
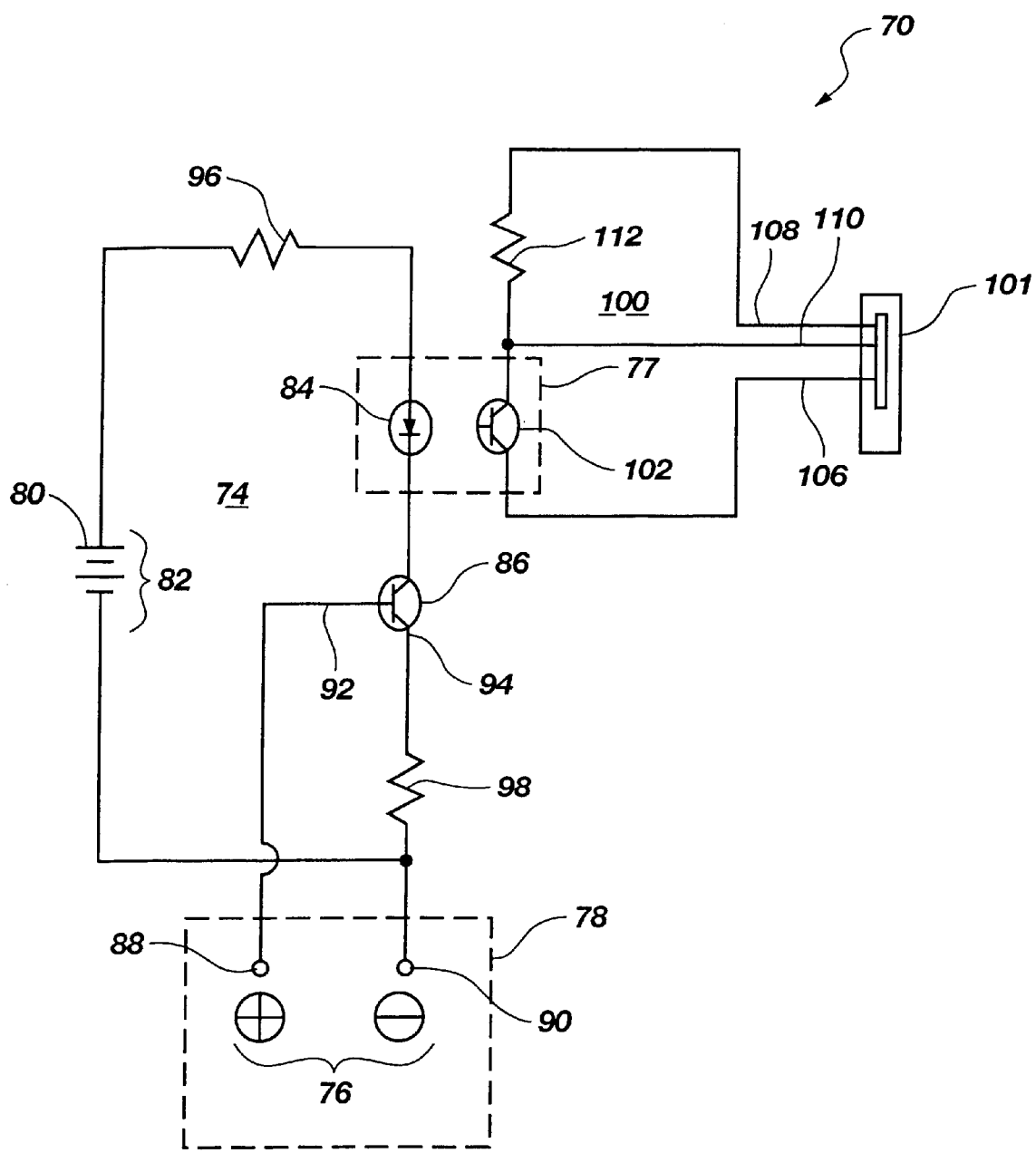
FIG. 4 is a circuit diagram of a signal isolation trigger box of a temperature measurement system of the invention.

Referring to drawing FIG. 4, shown is a trigger box circuit 70 by which a signal for initiating a temperature measurement is generated and transmitted to the thermometer controller 14.

The trigger box circuit 70 includes a primary circuit 74 activated by the voltage $V_{out}$ 76 across the wirebonder ultrasonic generator 78. The primary circuit 74 includes a voltage source 80 which applies a constant voltage 82 across a series-connected rectifier diode 84 and an NPN bipolar transistor 86. The positive output terminal 88 of the wirebonder ultrasonic generator 78 is connected to the base 92 of the NPN bipolar transistor 86, and the negative output terminal 90 is connected to the collector 94 of the transistor 86. Thus, a voltage signal 76 from the ultrasonic generator 78 results in a significant current gain or amplification.

The primary circuit 74 includes resistors 96 and 98 to control the circuit current.

A secondary circuit 100 includes a transistor 102 comprising a bilateral trigger diode having a grounded collector 101. The transistor 102 is triggered by current flow through the rectifier diode 84 to provide a voltage signal to the computer 18, and thence to the thermometer controller 14. The secondary circuit 100 is preferably connected to a computer 18 by a PC Game Control Adapter Port 104, controlled by an IBM standard PC Game Port Card and providing a ground lead 106, a constant voltage lead 108 having a series resistor 112, and a trigger lead 110. The transistor 102 and rectifier diode 84 together comprise a trigger 77.

In one example of a trigger box circuit 70 of the invention, the following specifications may be used:

transistor 86: N2221 transistor 102: 4N2G rectifier diode 84: any suitable type resistor 96: 200 ohms resistor 98: 2000 ohms resistor 112: 5100 ohms voltage source 80: +6.0 volts constant voltage lead 108: +5.0 volts When making temperature measurements without bonding wires, the ultrasonic generator is disconnected from its ultrasonic generator controller 78, and the voltage output 76 is used only to trigger the pulse of light in the thermometer controller 14 for temperature measurement.

As described herein, the temperature measuring/plotting apparatus may be used to plot temperatures on thermal maps of various configurations, as determined by the programs in the computer 18, wirebond machine 12 and/or thermometer controller 14. Thus, temperatures may be presented as time functions or location functions, or both, on a "map" or other numerical or graphical display format. For example, a series of thermal maps, each representing a different time interval from a given event, may be prepared to depict isothermal lines on the measured surface. Such will be useful in research and development studies related to semiconductor device manufacturing.

Use of a temperature measuring apparatus whose accuracy is not dependent upon surface characteristics is of great advantage, eliminating the repeated calibrations otherwise required.

Exemplary signal transmission cables and connections are indicated as connecting the major elements of the invention. However, other signal transmission apparatus may be used, including wireless infrared transmission, for example.

While the present method and apparatus have been described with respect to the modification of a conventional wire bonding apparatus, any suitable apparatus may be used which can provide the necessary parameters for the operation and control of the temperature measurement method and apparatus.

It may be evident to persons skilled in the art that various changes and modifications may be made in the temperature measuring method and apparatus of the invention as disclosed herein without departing from the spirit and scope of the invention as defined in the following claims.

What is claimed is:

1. An apparatus for measuring temperatures on a semiconductor die having an active surface having at least one bond pad thereon having one end of a wire bonded thereto in a wire bonding operation and for forming correlations of measured temperatures with locations on said active surface of said semiconductor die at a time of the measurement of said temperatures, said apparatus comprising:

a wire bonding machine having a bonding arm and an ultrasonic bonding generator controller;

a sensor probe mount attached to said bonding arm of said wire bonding machine;

a decay temperature sensor probe having a conductor having a sensing tip located on one end thereof and having an opposite signal output end, said decay temperature probe mounted in said sensor probe mount attached to said bonding arm of said wire bonding machine;

pulse generating apparatus connected to said opposite signal output end of said decay temperature sensor probe to generate a pulse through said conductor to material at said sensing tip and receiving from said opposite signal output end a signal representative of a temperature at said sensing tip;

an electronic trigger circuit connected to said wire bonding machine for initiating the generation of said pulse, said electronic trigger circuit initiating a signal for a temperature measurement upon receiving a voltage signal comprising an output signal of said ultrasonic bonding generator controller of said wire bonding machine;

thermometer apparatus for calculating a temperature indication from said signal representative of a temperature at said sensing tip;

stage apparatus attached to a portion of said wire bond machine for mounting said semiconductor die thereon;

control apparatus for manipulating a position of said stage apparatus relative to the sensing tip; and computing apparatus having software for receiving said temperature indication, and correlating and storing said temperature indication in machine-readable form as a function of one of time and location on said active surface of said semiconductor die.

2. The apparatus of claim 1, wherein said semiconductor die includes at least one bond pad connected to a portion of a leadframe and a semiconductor die having at least one bond pad connected to a portion of a substrate.

3. The apparatus of claim 1, wherein said sensor probe mount comprises a plurality of concentric tubular members connected together for passage of said conductor therethrough and attachment of said decay temperature sensor probe at one end thereof.

4. The apparatus of claim 1, wherein said computing apparatus comprises software for correlating said temperature indication with one of time and location on said active surface of said semiconductor die as a thermal map.

5. The apparatus of claim 1, wherein said sensor probe mount is mountable in a channel of a capillary holder.

6. The apparatus of claim 1, wherein said sensor probe mount is permanently mounted in a capillary holder removable from said bonding arm of said wire bonding machine.

7. An apparatus for measuring temperatures on a semiconductor die having an active surface having a plurality of bond pads thereon having a plurality of wire bonds connected thereto and for forming correlations of measured temperatures with locations on said active surface, said apparatus comprising:

a wire bonding machine including an arm and an ultrasonic bonding generator controller;

a sensor probe mount attached to said arm of said wire bonding machine;

a decay temperature sensor probe having a conductor having an end having a sensing tip thereon and an opposite signal output end, said decay temperature sensor probe mounted in said sensor probe mount attached to said arm of said wire bonding machine;

pulse generating apparatus connected to said opposite signal output end of said conductor for generating a pulse of light through said conductor to material at said sensing tip and receiving from said opposite signal output end a signal representative of a temperature at said sensing tip;

an electronic trigger circuit connected to said wire bonding machine for initiating the generation of said pulse of light, said electronic trigger circuit initiating a signal for a temperature measurement upon receiving a voltage signal comprising an output signal of said ultrasonic bonding generator controller of said wire bonding machine;

thermometer apparatus for calculating a temperature indication from said signal representative of a temperature at said sensing tip;

apparatus for mounting said semiconductor die thereon;

control apparatus for manipulating a position of said apparatus for mounting relative to the sensing tip mounted on said arm of said wire bonding machine; and computing apparatus having software for receiving said temperature indication, and correlating and storing said temperature indication as a function of time and location on said active surface of said semiconductor die.

8. The apparatus of claim 7, wherein said semiconductor die includes at least one semiconductor die connected to a leadframe and at least one other semiconductor die type electronic device connected to a substrate.

9. The apparatus of claim 7, wherein said sensor probe mount comprises a plurality of concentric tubular members connected together for passage of said conductor therethrough and attachment of said decay temperature sensor probe mount at one end thereof.

10. The apparatus of claim 7, wherein said computing apparatus includes software for correlating said temperature indication with time and location on said active surface of said semiconductor die as a thermal map.

11. The apparatus of claim 7, wherein said sensor probe mount is mountable in a channel of a capillary holder.

12. The apparatus of claim 7, wherein said sensor probe mount is mounted in a capillary holder removable from said arm of said wire bonding machine.

13. An apparatus for measuring temperatures on an object having a surface and forming correlations of measured temperatures with locations on said surface, said apparatus comprising:

a wire bonding machine including an arm and an ultrasonic bonding generator controller;

a sensor probe mount attached to said arm of said wire bonding machine;

a fluorescence decay temperature sensor probe having a conductor having a sensing tip on one end thereof and having an opposite signal output end, said fluorescence decay temperature sensor probe mountable in said sensor probe mount attached to said arm of said wire bonding machine;

pulse generating apparatus connected to said opposite signal output end for generating a pulse through said conductor to phosphorescent material at said sensing tip and receiving from said opposite signal output end of said conductor a decaying phosphorescent signal representative of a temperature at said sensing tip;

an electronic trigger circuit connected to said wire bonding machine for initiating the generation of said pulse, said electronic trigger circuit initiating a signal for a temperature measurement upon receiving a voltage signal comprising an output signal of said ultrasonic bonding generator controller of said wire bonding machine;

thermometer apparatus for calculating a temperature indication from said decaying phosphorescent signal;

a stage apparatus for mounting said object thereon;

control apparatus for manipulating a position of said stage apparatus relative to the sensing tip; and computing apparatus having software for receiving said temperature indication, and correlating and storing said temperature indication as a function of time and location on said surface of said object.

14. The apparatus of claim 13, wherein said object includes one of a semiconductor die, leadframe, substrate, and other electronic device.

15. The apparatus of claim 13, wherein said sensor probe mount attached to said arm of said wire bonding machine comprises a plurality of connected concentric tubular members for passage of said conductor therethrough and attachment of said sensor probe mount at one end thereof.

16. The apparatus of claim 13, wherein said computing apparatus comprises software for correlating said temperature indication with time and location on said surface as a thermal map.

17. The apparatus of claim 13, wherein said sensor probe mount is mountable in a channel of a capillary holder.

18. The apparatus of claim 13, wherein said sensor probe mount is permanently mounted in a capillary holder removable from said arm of said wire bonding machine.

19. A method for measuring temperatures on an object having a surface and forming correlations of measured temperatures, said method comprising:

providing a wire bonding machine including an arm and an ultrasonic bonding generator controller;

providing a sensor probe mount on said arm of said wire bonding machine;

providing a temperature sensor probe having a conductor having a sensing tip on one end thereof and a signal output end on another end thereof attached to said arm of said wire bonding machine;

initiating generation of a pulse using an electronic trigger circuit connected to said arm of said wire bonding machine, said electronic trigger circuit for a temperature measurement upon receiving a voltage signal comprising an output signal of an ultrasonic bonding generator controller of said wire bonding machine;

generating a pulse through said conductor to material at said sensing tip via means connected to said signal output end;

receiving from said signal output end a signal representative of a temperature at said sensing tip in a computational apparatus having software; and calculating a temperature indication from said signal.

20. The method of claim 19, further including the step of:

correlating and storing said temperature indication as a function of time and location on said object surface.

21. The method of claim 20, further including:

mounting said object on a support apparatus; and manipulating a position of said support apparatus relative to the sensing tip using a control apparatus.

22. The method of claim 19, wherein said object includes one of a semiconductor wafer, semiconductor die, leadframe, substrate, and other electronic device.

23. The method of claim 19, wherein said sensor probe mount comprises a plurality of connected members for passage of said conductor therethrough and attachment of said sensor probe mount at one end thereof.

24. The method of claim 20, wherein said correlating said temperature indication with time and location on said surface includes correlating said temperature indication as a thermal map of said object.

25. The method of claim 19, further including mounting said sensor probe mount in a channel of a capillary holder on said arm of said wire bonding machine.

26. The method of claim 19, further including permanently mounting said sensor probe mount in a capillary holder removable from said arm.

27. A temperature measuring method for measuring temperatures on an object having a surface and forming correlations of measured temperatures with locations on said surface, said method comprising:

providing a wire bonding machine including an arm, a mounting apparatus, and an ultrasonic bonding generator controller;

mounting a sensor probe mount on said arm of said wire bonding machine;

providing a miniature fluorescence temperature sensor probe having a conductor having a sensing tip end and an opposite signal output end, said miniature fluorescence temperature sensor probe mounted in said sensor probe mount on said arm of said wire bonding machine;

providing an apparatus connected to said opposite signal output end;

initiating a signal using an electronic trigger circuit connected to the wire bonding machine for a temperature measurement upon receiving a voltage signal comprising an output signal of said ultrasonic bonding generator controller of said wire bonding machine;

generating a light pulse through said conductor to phosphorescent material at said sensing tip end;

receiving from said opposite signal output end a decaying phosphorescent signal representative of a temperature at said sensing tip end;

initiating the generation of said light pulse using the electronic trigger circuit connected to said wire bonding machine;

calculating a temperature indication from said decaying phosphorescent signal;

mounting said object on said mounting apparatus of said wire bonding machine;

manipulating a position of said mounting apparatus relative to the sensing tip end;

computing and correlating and storing said temperature indication as a function of time and location on said surface of said object using a computational apparatus.

28. The method claim 27, wherein said object includes one of a semiconductor wafer, semiconductor die, leadframe, substrate, and other electronic device.

29. The method of claim 27, wherein said sensor probe mount comprises a plurality of concentric connected tubular members for passage of said conductor therethrough and attachment of said sensor probe mount at one end thereof.

30. The method of claim 27, wherein said computational apparatus includes software for correlating said temperature indication with location on said surface as a thermal map.

31. The method of claim 27, wherein said sensor probe mount is mountable in a channel of a capillary holder.

32. The method of claim 31, wherein said sensor probe mount is permanently mounted in a capillary holder removable from said arm of said wire bonding machine.

33. An apparatus for measuring temperatures on a semiconductor die having an active surface having at least one bond pad thereon having one end of a wire bonded thereto in a wire bonding operation and forming correlations of measured temperatures with locations on said active surface of said semiconductor die at a time of the measurement of said temperatures subsequent to bonding of an end of a wire to said at least one bond pad on said active surface of said semiconductor die, said apparatus comprising:

a wire bonding machine having a bonding arm and an ultrasonic bonding generator controller;

a sensor probe mount attached to said bonding arm of said wire bonding machine;

a decay temperature sensor probe having a fiber optic conductor with a sensing tip and an opposite signal output end, said decay temperature sensor probe mountable in said sensor probe mount attached to said bonding arm of said wire bonding machine;

light pulse generating apparatus connected to said opposite signal output end for generating a pulse of light through said fiber optic conductor to material at said sensing tip and receiving from said opposite signal output end a decaying signal representative of a temperature at said sensing tip;

a signal isolation trigger circuit connected to said wire bonding machine for initiating the generation of said light pulse, said signal isolation trigger circuit initiating a signal for a temperature measurement upon receiving an electrical voltage signal comprising an output signal of said ultrasonic bonding generator controller of said wire bonding machine;

calculating apparatus for calculating a temperature indication from said decaying signal;

stage apparatus for mounting said semiconductor die thereon attached to a portion of said wire bonding machine;

control apparatus for manipulating a position of said stage apparatus relative to the sensing tip; and computing apparatus having software for receiving said temperature indication, and correlating and storing said temperature indication in machine-readable form as a function of one of time and location on said active surface of said semiconductor die subsequent to the bonding of one end of a wire to said at least one bond pad on the active surface of said semiconductor die.

34. The apparatus of claim 33, wherein said semiconductor die includes one of a semiconductor die in wafer form, a semiconductor die having at least one bond pad connected to a portion of a leadframe and other semiconductor die electronic devices.

35. The apparatus of claim 33, wherein said sensor probe mount comprises a plurality of concentric tubular members overlappingly fitted together for passage of said fiber-optic conductor therethrough and attachment of said decay temperature sensor probe at one end thereof.

36. The apparatus of claim 33, wherein said sensor probe mount is permanently mounted in a capillary holder removable from said bonding arm of said wire bonding machine.

37. An apparatus for measuring temperatures on a semiconductor die having an active surface having a plurality of bond pads thereon having a plurality of wire bonds connected thereto and forming correlations of measured temperatures with locations on said active surface, said apparatus comprising:

a wire bonding machine having an arm and an ultrasonic bonding generator controller;

a sensor probe mount attached to said arm of said wire bonding machine;

a decay temperature sensor probe having a fiber optic conductor with a sensing tip and an opposite signal output end, said decay temperature sensor probe mounted in said sensor probe mount attached to said arm of said wire bonding machine;

light pulse generating apparatus connected to said opposite signal output end for generating a pulse of light through said fiber optic conductor to material at said sensing tip and receiving from said opposite signal output end a decaying signal representative of a temperature at said sensing tip;

a signal isolation trigger circuit connected to said wire bonding machine for initiating the generation of said light pulse, said signal isolation trigger circuit initiating a signal for a temperature measurement upon receiving an electrical voltage signal comprising an output signal of said ultrasonic bonding generator controller of said wire bonding machine;

calculating apparatus for calculating a temperature indication from said decaying signal;

apparatus for mounting said semiconductor die thereon located on a portion of said wire bonding machine;

control apparatus for manipulating a position of said apparatus for mounting relative to the sensing tip mounted on said arm of said wire bonding machine; and computing apparatus having software for receiving said temperature indication, and correlating and storing said temperature indication in machine-readable form as a function of one of time and location on said active surface of said semiconductor die.

38. The apparatus of claim 37, wherein said semiconductor die includes one of a semiconductor die in wafer form, a semiconductor die connected to a leadframe and other semiconductor die type electronic devices.

39. The apparatus of claim 37, wherein said sensor probe mount is permanently mounted in a capillary holder removable from said arm of said wire bonding machine.

40. An apparatus for measuring temperatures on an object having a surface and forming correlations of measured temperatures with locations on said surface, said apparatus comprising:

a wire bonding machine having an arm and an ultrasonic bonding generator controller;

a sensor probe mount attached to said arm of said wire bonding machine;

a fluorescence decay temperature sensor probe having a fiber optic conductor with a sensing tip and an opposite signal output end, said fluorescence decay temperature sensor probe mountable in said sensor probe mount attached to said arm of said wire bonding machine;

light pulse generating apparatus connected to said opposite signal output end for generating a pulse of light through said fiber optic conductor to phosphorescent material at said sensing tip and receiving from said opposite signal output end a decaying phosphorescent signal representative of a temperature at said sensing tip;

a signal isolation trigger circuit connected to said wire bonding machine for initiating the generation of said light pulse, said signal isolation trigger circuit initiating a signal for a temperature measurement upon receiving an electrical voltage signal comprising an output signal of said ultrasonic bonding generator controller of said wire bonding machine;

calculating apparatus for calculating a temperature indication from said decaying phosphorescent signal;

a stage for mounting said object thereon on a portion of said wire bonding machine;

control apparatus for manipulating a position of said stage relative to the sensing tip; and computing apparatus having software for receiving said temperature indication, and correlating and storing said temperature indication in machine-readable form as a function of one of time and location on said surface of said object.

41. The apparatus of claim 40, wherein said sensor probe mount attached to said arm of said wire bonding machine comprises a plurality of concentric tubular members overlappingly fitted together for passage of said fiber-optic conductor therethrough and attachment of said fluorescence decay temperature sensor probe at one end thereof.

42. The apparatus of claim 40, wherein said computing apparatus comprises software for correlating said temperature indication with one of time and location on said surface as a thermal map.

43. A method for measuring temperatures on an object having a surface and forming correlations of measured temperatures, said method comprising:

providing a wire bonding machine having an arm and an ultrasonic bonding generator controller;

providing a sensor probe mount on said arm of said wire bonding machine;

providing a decay temperature sensor probe having a fiber optic conductor with a sensing tip and a signal output end attached to said arm of said wire bonding machine;

initiating generation of a light pulse using a signal isolation trigger circuit connected to said arm of said wire bonding machine, said signal isolation trigger circuit for a temperature measurement upon receiving an electrical voltage signal comprising an output signal of an ultrasonic bonding generator controller of said wire bonding machine;

generating a pulse of light through said fiber optic conductor to material at said sensing tip via means connected to said signal output end;

receiving from said signal output end a signal representative of a temperature at said sensing tip in machine-readable form in a computational apparatus having software; and calculating a temperature indication from said electrical voltage signal.

44. The method of claim 43, further including:

mounting said object on a support apparatus; and manipulating a position of said support apparatus relative to the sensing tip using a control apparatus.

45. The method of claim 43, wherein said sensor probe mount comprises a plurality of tubular members fitted together for passage of said fiber-optic conductor therethrough and attachment of said sensor probe at one end thereof.

46. The method of claim 43, further including:

correlating said temperature indication with one of time and location on said surface as a thermal map of said object.

47. A method for measuring temperatures on an object having a surface and forming correlations of measured temperatures with locations on said surface at a time of the measurement of said temperatures, said method comprising:

providing a wire bonding apparatus having an arm and an ultrasonic bonding generator controller;

providing a sensor probe mount attached to a portion of said arm of said wire bonding apparatus;

providing a decay temperature sensor probe having a fiber optic conductor with a sensing tip and a signal output end;

mounting said decay temperature sensor probe in said sensor probe mount attached to said portion of said arm of said wire bonding apparatus;

initiating generation of a light pulse using a signal isolation trigger circuit connected to said wire bonding apparatus, said signal isolation trigger circuit initiating a signal for a temperature measurement upon receiving an electrical voltage signal comprising an output signal of said ultrasonic bonding generator controller of said wire bonding apparatus;

generating a pulse of light through said fiber optic conductor to material at said sensing tip via apparatus connected to said signal output end;

receiving from said signal output end a signal representative of a temperature at said sensing tip in machine-readable form in a computational apparatus having software;

calculating a temperature indication from said signal; and correlating and storing said temperature indication as a function of one of time and location on said surface of said object.

48. A method for measuring temperatures on an object having a surface and forming correlations of measured temperatures with locations on said surface, said method comprising:

providing a wire bonding machine having an arm, a mounting apparatus, and an ultrasonic bonding generator controller;

mounting a sensor probe mount to said arm of said wire bonding machine;

providing a miniature fluorescence decay temperature sensor probe having a fiber optic conductor with a sensing tip and an opposite signal output end, said miniature fluorescence decay temperature sensor probe mounted in said sensor probe mount of said arm of said wire bonding machine;

providing an apparatus connected to said opposite signal output end;

initiating a signal using a signal isolation trigger circuit connected to the wire bonding machine for a temperature measurement upon receiving an electrical voltage signal comprising an output signal of said ultrasonic bonding generator controller of said wire bonding machine;

generating a pulse of light through said fiber optic conductor to phosphorescent material at said sensing tip;

receiving from said opposite signal output end a decaying phosphorescent signal representative of a temperature at said sensing tip;

initiating the generation of said light pulse using the signal isolation trigger circuit connected to said wire bonding machine;

calculating a temperature indication from said decaying phosphorescent signal;

mounting said object on said mounting apparatus of said wire bonding machine;

manipulating a position of said mounting apparatus relative to the sensing tip;

computing and correlating and storing said temperature indication in machine-readable form as a function of one of time and location on said surface of said object using a computational apparatus.

* * * * *